(12) United States Patent
Hsieh

(10) Patent No.: US 11,444,164 B2
(45) Date of Patent: Sep. 13, 2022

(54) SHIELDED GATE TRENCH MOSFET HAVING IMPROVED SPECIFIC ON-RESISTANCE STRUCTURES

(71) Applicant: Nami MOS CO., LTD., New Taipei (TW)

(72) Inventor: Fu-Yuan Hsieh, New Taipei (TW)

(73) Assignee: NAMI MOS CO., LTD., New Taipei (TW)

( * ) Notice: Subject to any disclaimer, the term of this patent is extended or adjusted under 35 U.S.C. 154(b) by 0 days.

(21) Appl. No.: 17/092,360

(22) Filed: Nov. 9, 2020

(65) Prior Publication Data

US 2022/0149161 A1    May 12, 2022

(51) Int. Cl.
| | | |
|---|---|---|
| *H01L 29/40* | (2006.01) | |
| *H01L 29/06* | (2006.01) | |
| *H01L 29/78* | (2006.01) | |
| *H01L 29/423* | (2006.01) | |
| *H01L 29/10* | (2006.01) | |

(52) U.S. Cl.
CPC ........ *H01L 29/407* (2013.01); *H01L 29/0623* (2013.01); *H01L 29/0634* (2013.01); *H01L 29/1095* (2013.01); *H01L 29/42364* (2013.01); *H01L 29/7811* (2013.01); *H01L 29/7813* (2013.01)

(58) Field of Classification Search
CPC ............... H01L 29/407; H01L 29/0623; H01L 29/0634; H01L 29/1095; H01L 29/42364; H01L 29/7811; H01L 29/7813; H01L 29/0696; H01L 29/7375; H01L 29/7393–7395; H01L 29/7397; H01L 29/66325; H01L 29/66333–66348
See application file for complete search history.

(56) References Cited

U.S. PATENT DOCUMENTS

| | | | | |
|---|---|---|---|---|
| 7,719,053 B2 * | 5/2010 | Nakamura | ............ | H01L 29/407 |
| | | | | 257/330 |
| 8,373,225 B2 * | 2/2013 | Hsieh | ................. | H01L 29/7811 |
| | | | | 438/270 |

\* cited by examiner

*Primary Examiner* — Cuong B Nguyen
(74) *Attorney, Agent, or Firm* — Bacon & Thomas, PLLC

(57) ABSTRACT

A SGT MOSFET having two stepped oxide (TSO) structure in gate trench is disclosed, wherein the TSO has thinner oxide thickness along upper sidewalls of the gate trench than along lower sidewalls of the gate trench. The BV can be enhanced as result of the electric filed reduction near channel region, on-resistance is thus reduced. The present invention further comprises a super junction region below the oxide charge balance region, making vertical electrical field more uniform, the BV is further enhanced and on-resistance is further reduced.

8 Claims, 11 Drawing Sheets

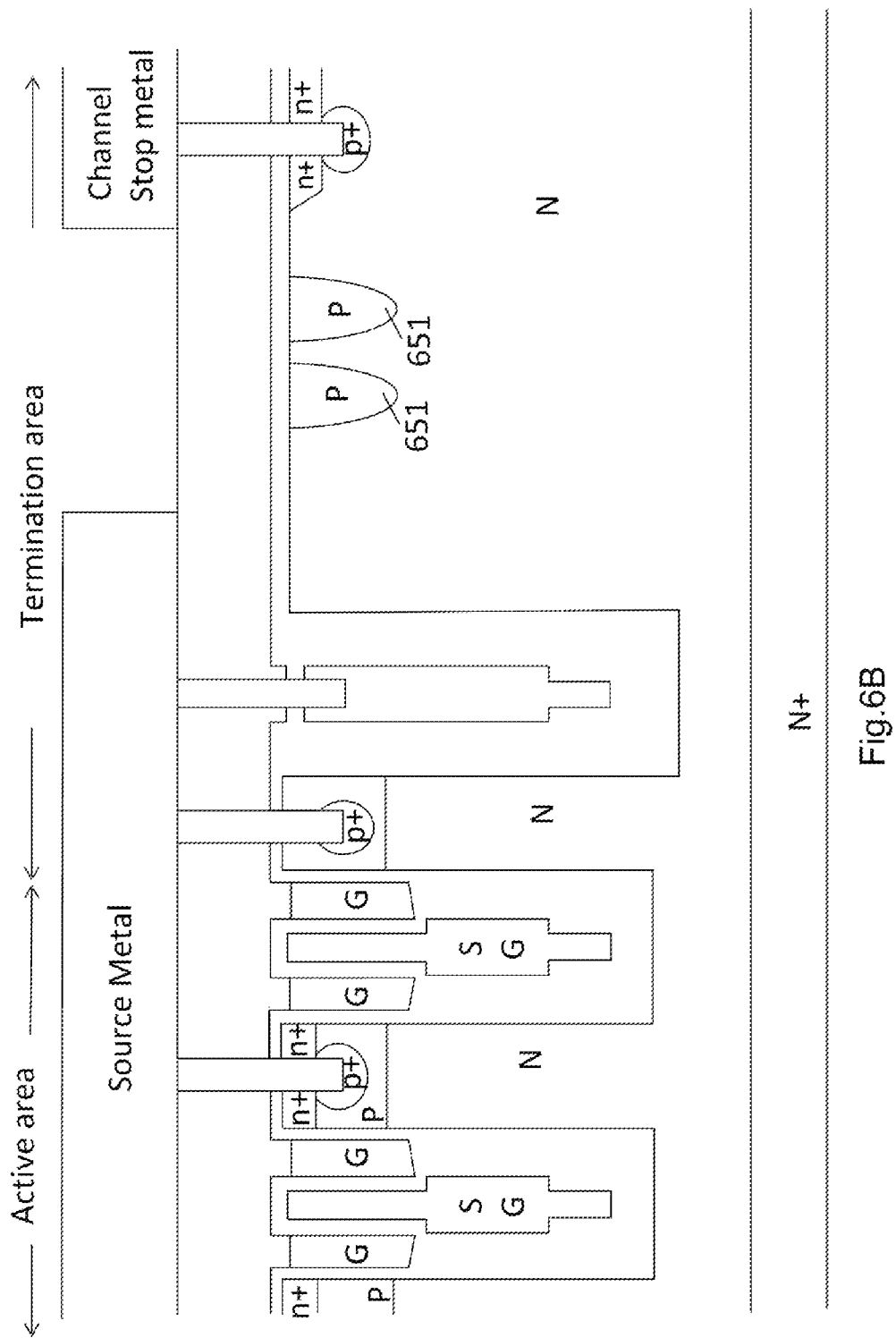

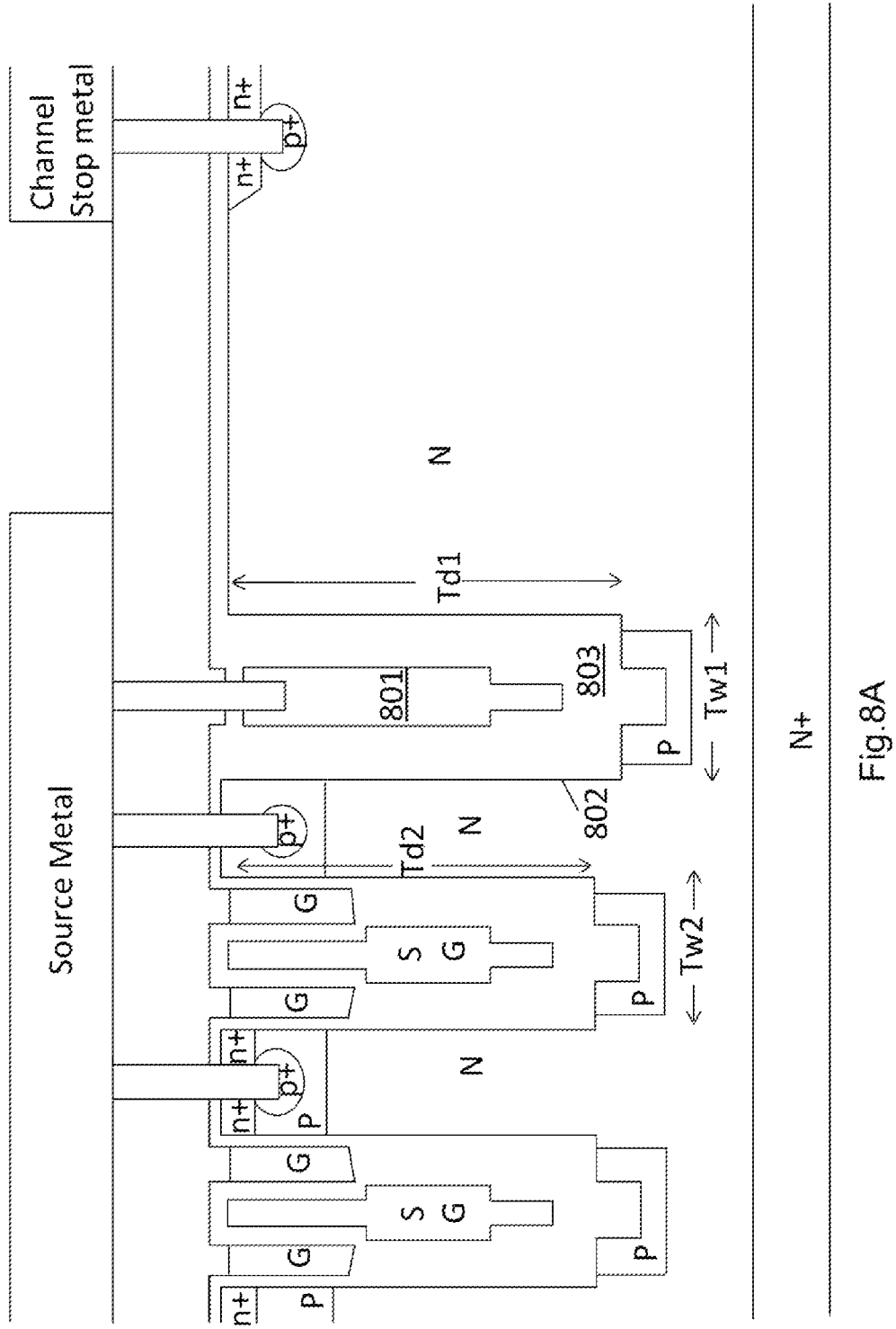

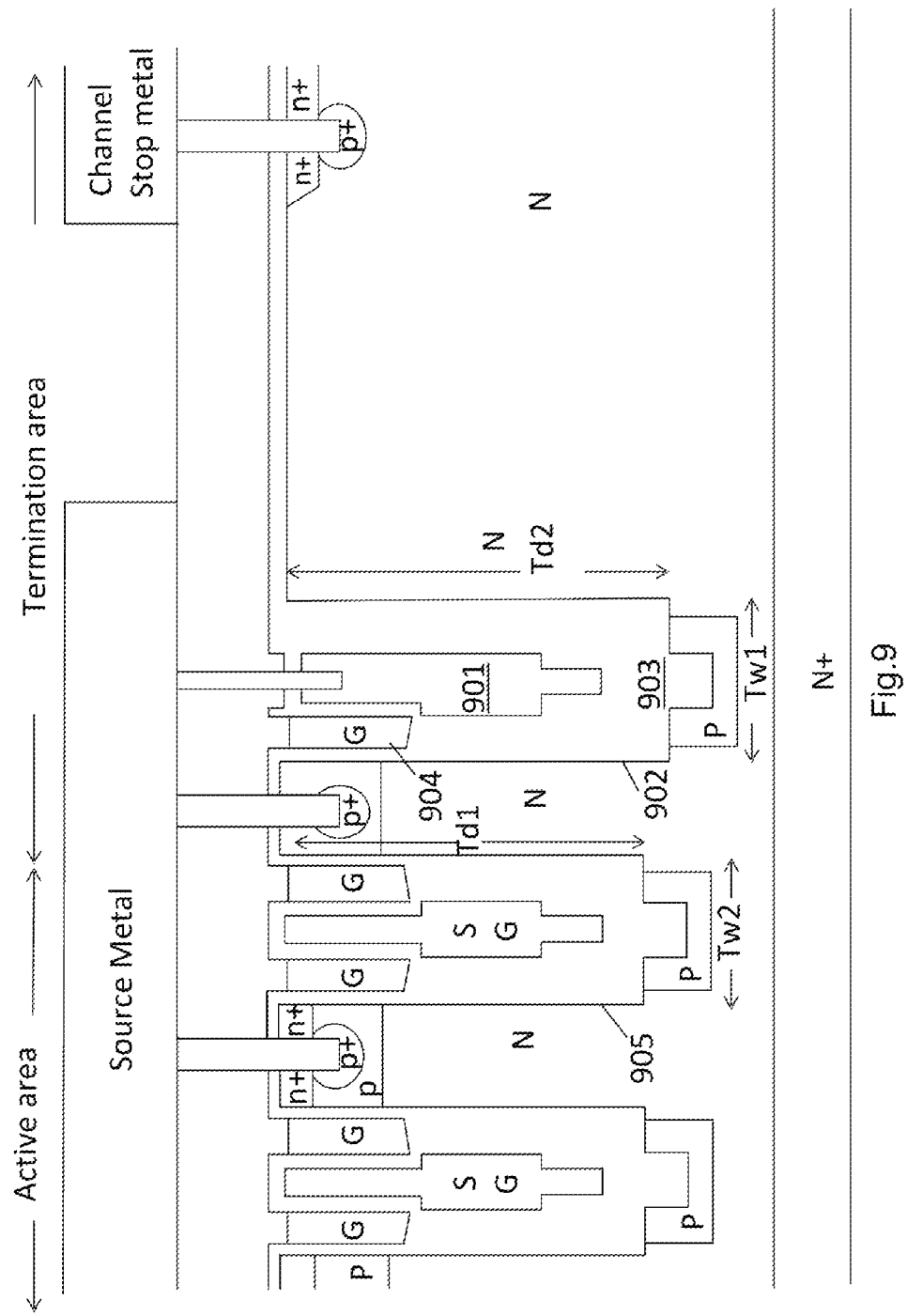

SHIELDED GATE TRENCH MOSFET HAVING IMPROVED SPECIFIC ON-RESISTANCE STRUCTURES

FIELD OF THE INVENTION

This invention relates generally to semiconductor devices, and more particularly, to a shielded gate trench MOSFET (Metal Oxide Semiconductor Field Effect Transistor) having improved specific on-resistance structures.

BACKGROUND OF THE INVENTION

FIG. 1 shows a shielded gate trench MOSFET (SGT) having a pair of split gate electrodes 101 surrounding shielded gate electrodes 102, which has much lower gate charge and on-resistance compared with traditional single gate trench MOSFETs as results of existence of oxide charge balance region in drift region and thick oxide underneath gate electrodes 101. However, in the structure of FIG. 1, vertical electric field of the near channel region is higher than other portion, which degrades breakdown voltage (BV).

Therefore, there is still a need in the art of the semiconductor device design, particularly for SGT MOSFET design, to provide a novel cell structure and device configuration that making an SGT MOSFET have lower on-resistance without degrading breakdown voltage.

SUMMARY OF THE INVENTION

The present invention provides a SGT MOSFET with TSO (two stepped oxide) structure below the split gate electrodes, which has thinner oxide along upper sidewall of gate trenches than along lower sidewall. The BV can be enhanced as result of the electric field reduction near channel region, on-resistance is thus reduced. Moreover, the present invention provides a SGT MOSFET with TSO and super junction region below the oxide charge balance region, making vertical electric field more uniform, the BV is further enhanced and on-resistance is further reduced.

According to one aspect, the invention features a SGT MOSFET formed in an epitaxial layer of a first conductivity type onto a substrate of the first conductivity type, further comprising: a plurality of gate trenches surrounded by source regions of the first conductivity type encompassed in body regions of a second conductivity type near a top surface of the epitaxial layer, each of the gate trenches having a shielded gate electrode disposed in the middle and a pair of split gate electrodes disposed surrounding upper portion of the shielded gate electrode; a two stepped oxide (TSO) as a first oxide layer formed below the split gate electrodes in each of the gate trenches, the TSO having greater oxide thickness along lower sidewalls of the gate trenches than along upper sidewalls; a second oxide layer as a gate oxide formed between the gate electrodes and adjacent sidewalls of the gate trenches; and a third oxide layer formed on upper portion of the shielded electrode during gate oxide growth, isolating the shielded gate electrode from the gate electrode.

According to another aspect, in some preferred embodiment, each of the gate trenches further comprises a first type gate trench and a second type gate trench in the epitaxial layer, wherein: the second type gate trench is below the first type gate trench and has trench width narrower than the first type gate trench; the second type gate trench is fully filled up with the first oxide layer and is surrounded by a super junction region; and the super junction region has a first doped column region of the second conductivity type formed adjacent to sidewalls of the second type gate trench, and a second doped column region of the first conductivity type formed in parallel and surrounded with the first doped column region.

According to another aspect, in some preferred embodiments, the epitaxial layer comprises a single epitaxial layer having uniform doping concentration. In some other preferred embodiments, the epitaxial layer comprises a lower epitaxial layer between the substrate and the super junction region with resistivity R1, and an upper epitaxial layer with resistivity R2, wherein R1<R2. In some other preferred embodiments, the epitaxial layer comprises a lower epitaxial layer between the substrate and the super junction region with resistivity R1, a middle epitaxial layer located in the super junction region with resistivity R2 and an upper epitaxial layer with resistivity R3, wherein R1<R2<R3 or R1<R3<R2.

According to another aspect, in some preferred embodiments, the present invention further comprises a termination area having at least one trench filed plate surrounded with the TSO. Furthermore, in some preferred embodiments, the termination area further comprises multiple floating body regions of the second conductivity type and having floating voltage. In some other preferred embodiments, the present invention further comprises a termination area having at least one trench filed plate surrounded with the TSO at one sidewall of a gate trench, and with a gate electrode at another sidewall of upper portion of the gate trench near active area.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The accompanying drawings, which are included to provide a further understanding of the invention and are incorporated in and constitute a part of this specification, illustrate exemplary embodiments of the invention and together with the description serve to explain the principles of the invention. In the drawings:

FIG. 6B is a cross-sectional view of another preferred embodiment according to the present invention.

FIG. 8A is a cross-sectional view of another preferred embodiment according to the present invention.

FIG. 9 is a cross-sectional view of another preferred embodiment according to the present invention.

DETAILED DESCRIPTION OF THE EMBODIMENTS

In the following Detailed Description, reference is made to the accompanying drawings, which forms a part thereof, and in which is shown by way of illustration specific embodiments in which the invention may be practiced. In this regard, directional terminology, such as "top", "bottom", "front", "back", etc., is used with reference to the orientation of the Figure(s) being described. Because components of embodiments can be positioned in a number of different orientations, the directional terminology is used for purpose of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1:
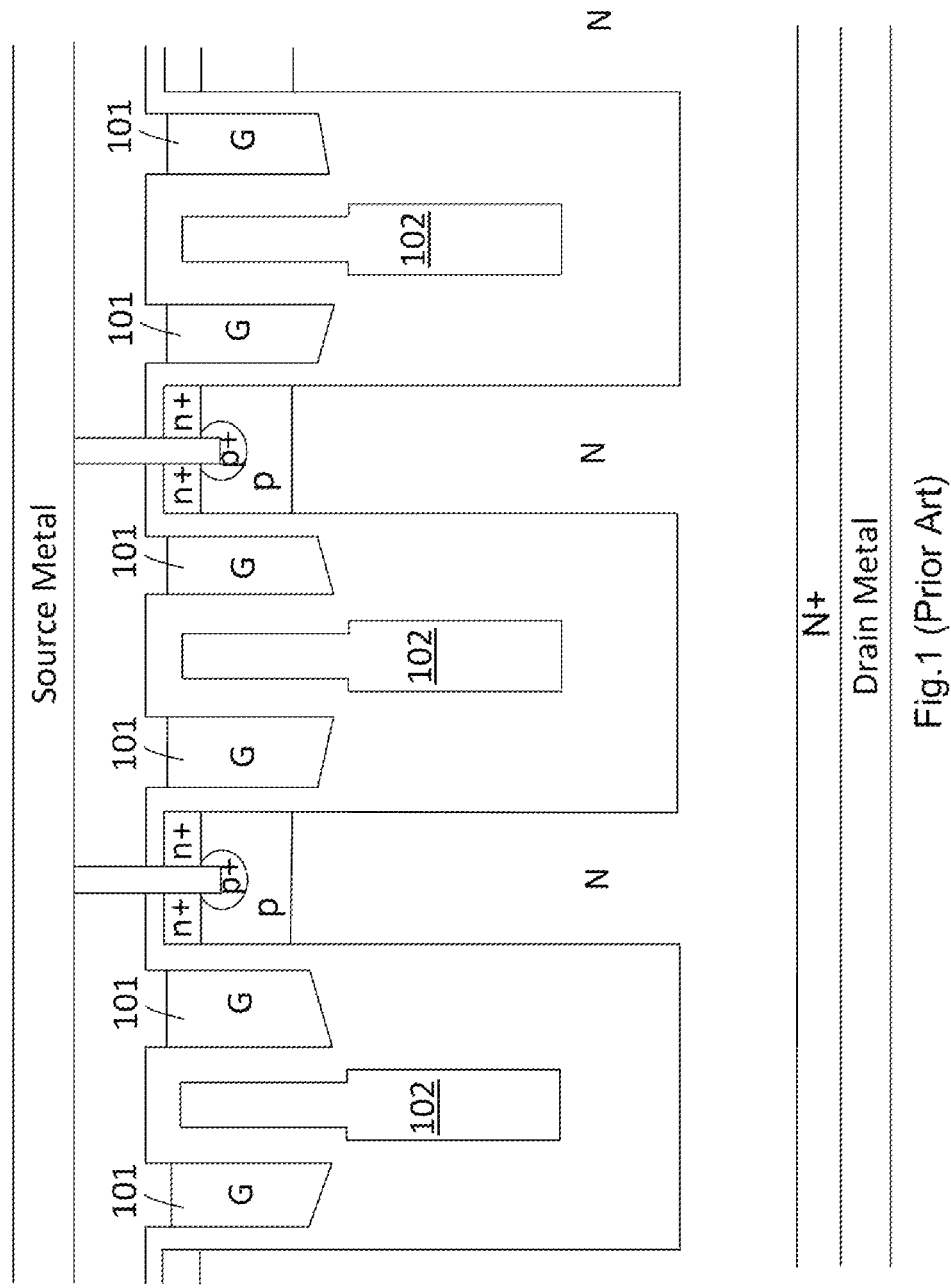
FIG. 1 is a cross-sectional view of an SGT MOSFET of prior art.
Figure 2:
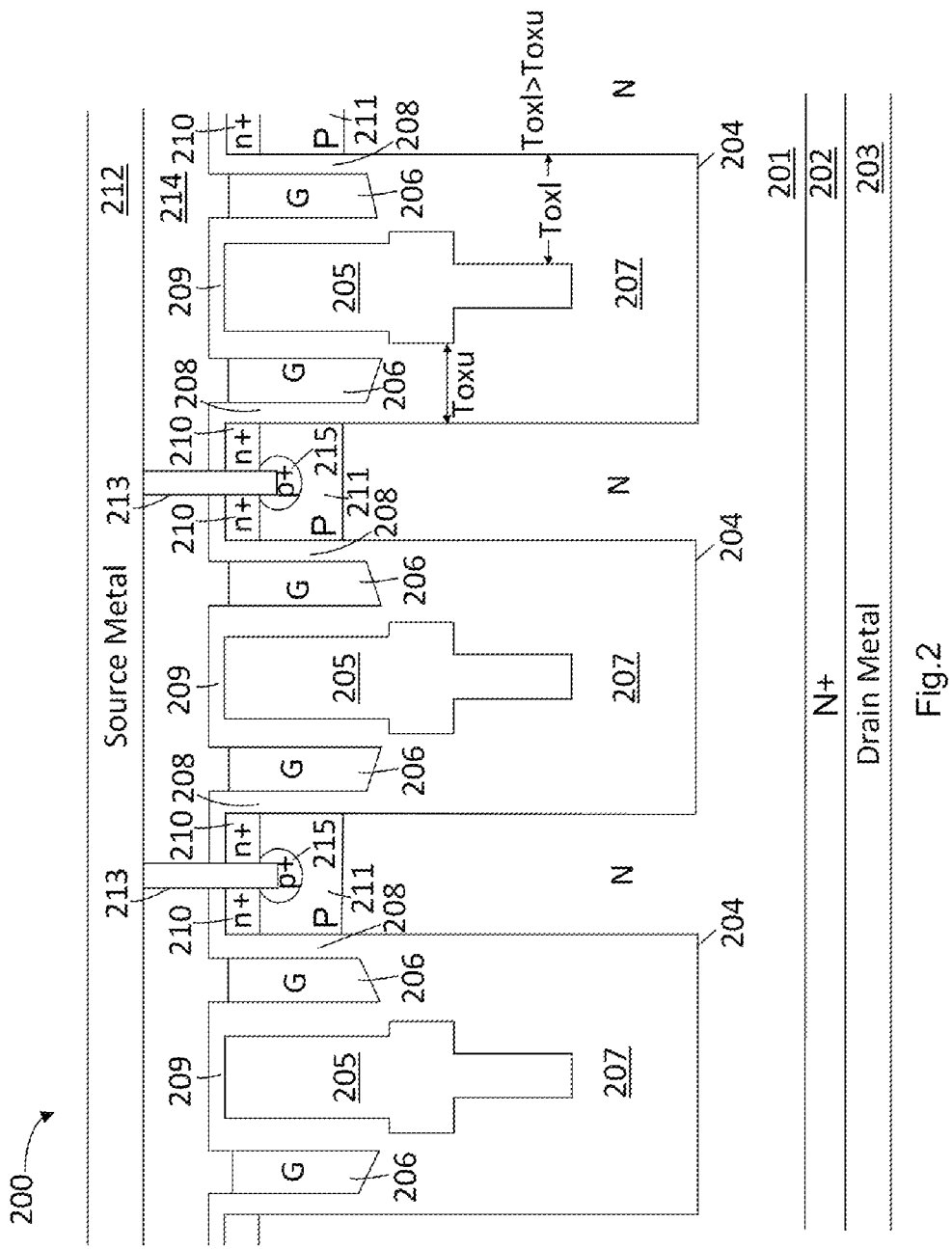
FIG. 2 is a cross-sectional view of a preferred embodiment according to the present invention.

Please refer to FIG. 2 for a preferred embodiment of this invention. An N-channel SGT MOSFET 200 is formed in an N epitaxial layer 201 extending onto an N+ substrate 202 coated with a back metal layer on rear side as drain metal 203. The SGT MOSFET 200 further comprises a plurality of gate trenches 204 extending vertically downward from top surface of the N epitaxial layer 201. Each of the gate trenches 204 comprises a shielded gate electrode 205 in the middle and a pair of split gate electrodes 206 surrounding upper portion of the shielded gate electrode. According to the present invention, the shielded gate electrode 205 in each the gate trench 204 is padded by a two stepped oxide (TSO) below the split gate electrodes 206 as a first oxide layer 207, wherein the TSO has a greater oxide thickness Tox1 along lower sidewalls of the gate trench 204 than oxide thickness Toxu along upper sidewalls of the gate trench 204, therefore, the shielded gate electrode 205 each has a narrower width in lower portion than in upper portion. A second oxide layer 208 is formed between each the split gate electrode 206 and adjacent sidewall of the gate trench 204 as a gate oxide layer, and a third oxide layer 209 is formed on upper portion of each the shielded gate electrode 205 during gate oxide growth to isolate the shielded gate electrode 205 from the split gate electrodes 206. The split gate electrodes 206 in each the gate trench 204 are surrounded by n+ source regions 210 encompassed in P body regions 211 near the top surface of the N epitaxial layer 201. The P body regions 211 are further connected to a source metal 212 though a plurality of trenched contacts 213 filled with meta plugs and penetrating through a thick oxide layer 214 sandwiched between the source metal 212 and the epitaxial layer, wherein the trenched contacts 213 are further extending through the n+ source regions 210 and penetrating into the P body regions 211, with bottoms surrounded by p+ doped regions 215 to reduce contact resistance between metal plugs and the P body regions 211.

Please refer to FIG. 3 for another preferred embodiment of the present invention, compared with FIG. 2, the N-channel SGT MOSFET 300 in FIG. 3 comprises a first type gate trench 301 and a second type gate trench 302 in the N epitaxial layer 303, wherein each the second type gate trench 302 is formed below a first type gate trench 301 and has trench width narrower than the first type gate trench. Meanwhile, each the second type gate trench 302 is fully filled up with the first oxide layer 304 and is surrounded by a super junction region which comprises a first P doped column region 305 adjacent to sidewalls of the second type gate trench 302 and a second N doped column region, which is the N epitaxial layer 303, formed in parallel and surrounded with the first N doped column region 305.

Figure 3:
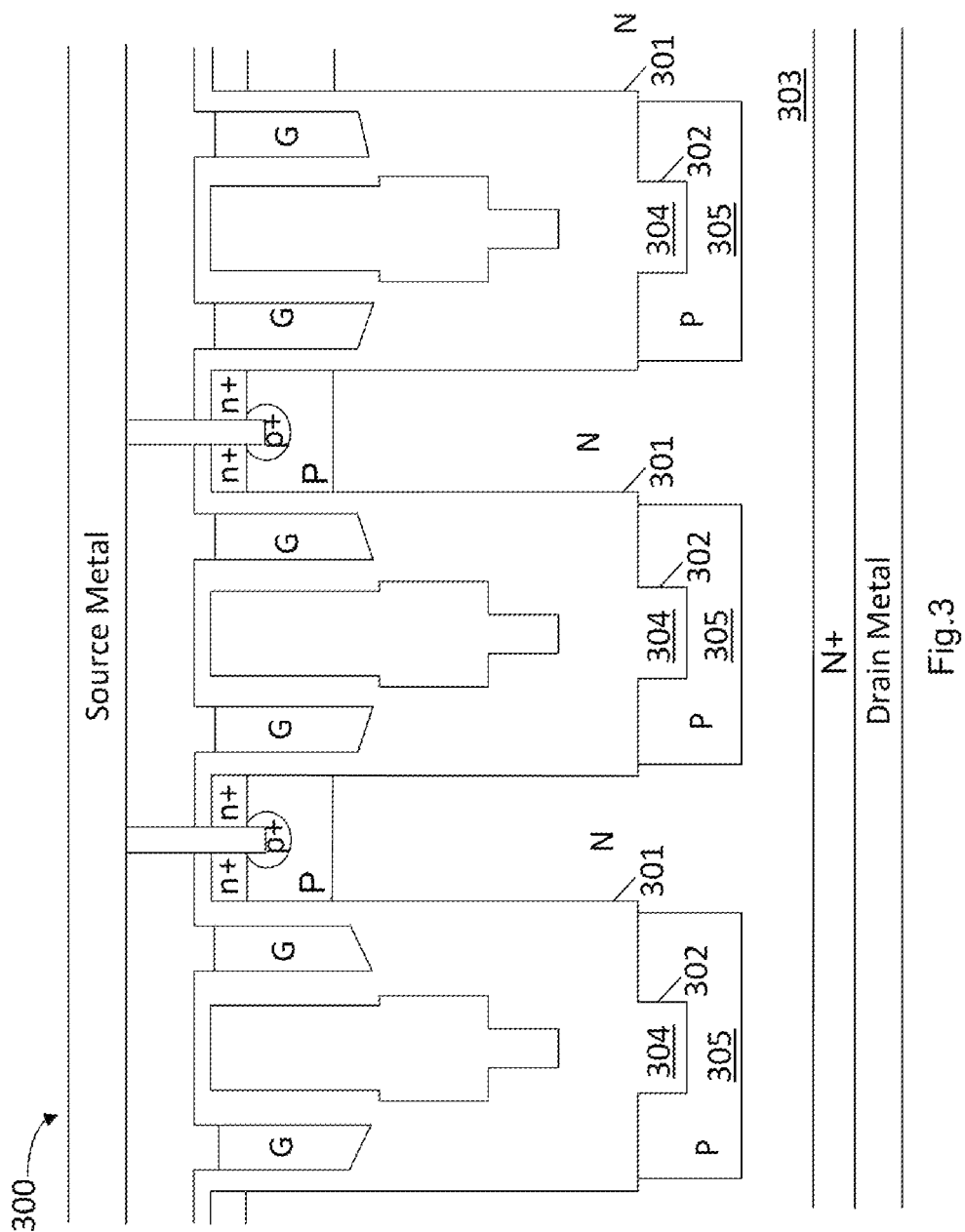
FIG. 3 is a cross-sectional view of another preferred embodiment according to the present invention.
Figure 4:
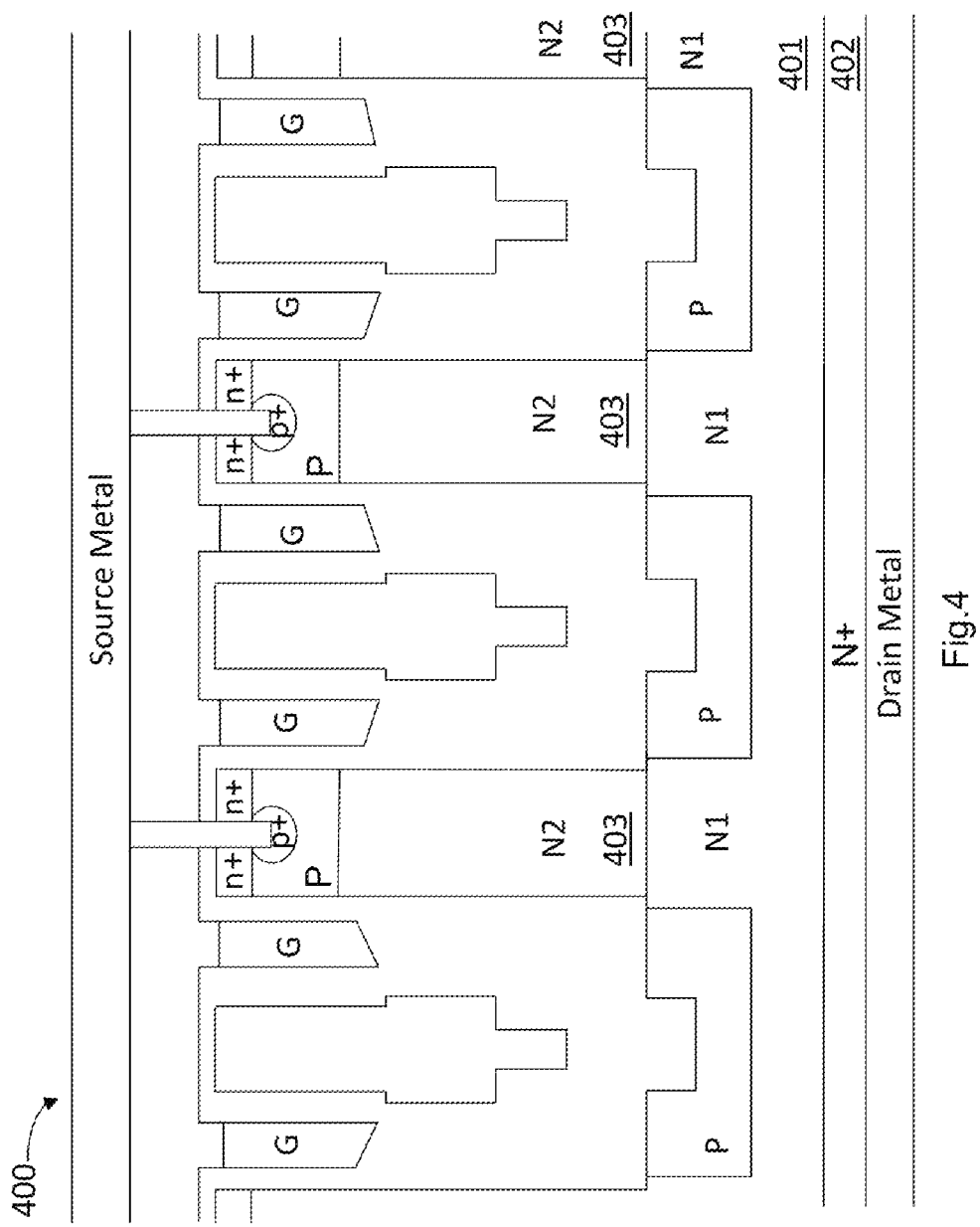
FIG. 4 is a cross-sectional view of another preferred embodiment according to the present invention.

Please refer to FIG. 4 for another preferred embodiment of the present invention, compared with FIG. 3, the N-channel SGT MOSFET 400 in FIG. 4 comprises: a lower epitaxial layer N1 401 having resistivity R1 and formed between the N+ substrate 402 and the super junction region; and an upper epitaxial layer N2 403 having resistivity R2 and above the super junction region, wherein R1<R2.

Figure 5:
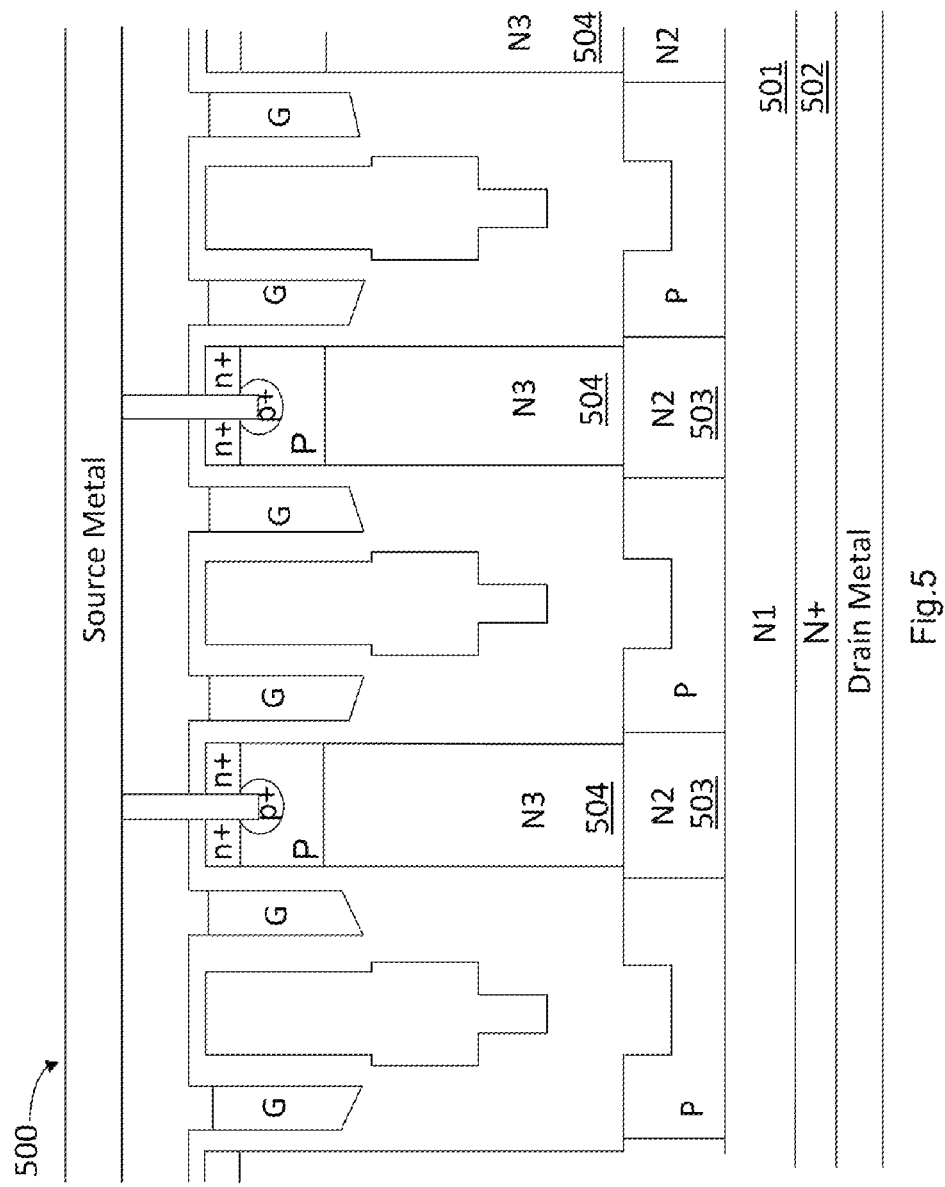
FIG. 5 is a cross-sectional view of another preferred embodiment according to the present invention.

Please refer to FIG. 5 for another preferred embodiment of the present invention, compared with FIG. 3, the N-channel SGT MOSFET 500 in FIG. 5 comprises: a lower epitaxial layer N1 501 having resistivity R1 and between the N+ substrate 502 and the super junction region; a middle epitaxial layer N2 503 having resistivity R2 and located in the super junction region; and an upper epitaxial layer N3 504 having resistivity R3 and above the super junction region, wherein R1<R2<R3. In some other preferred embodiments, the relationship between R1, R2 and R3 also can be R1<R3<R2.

Figure 6A:
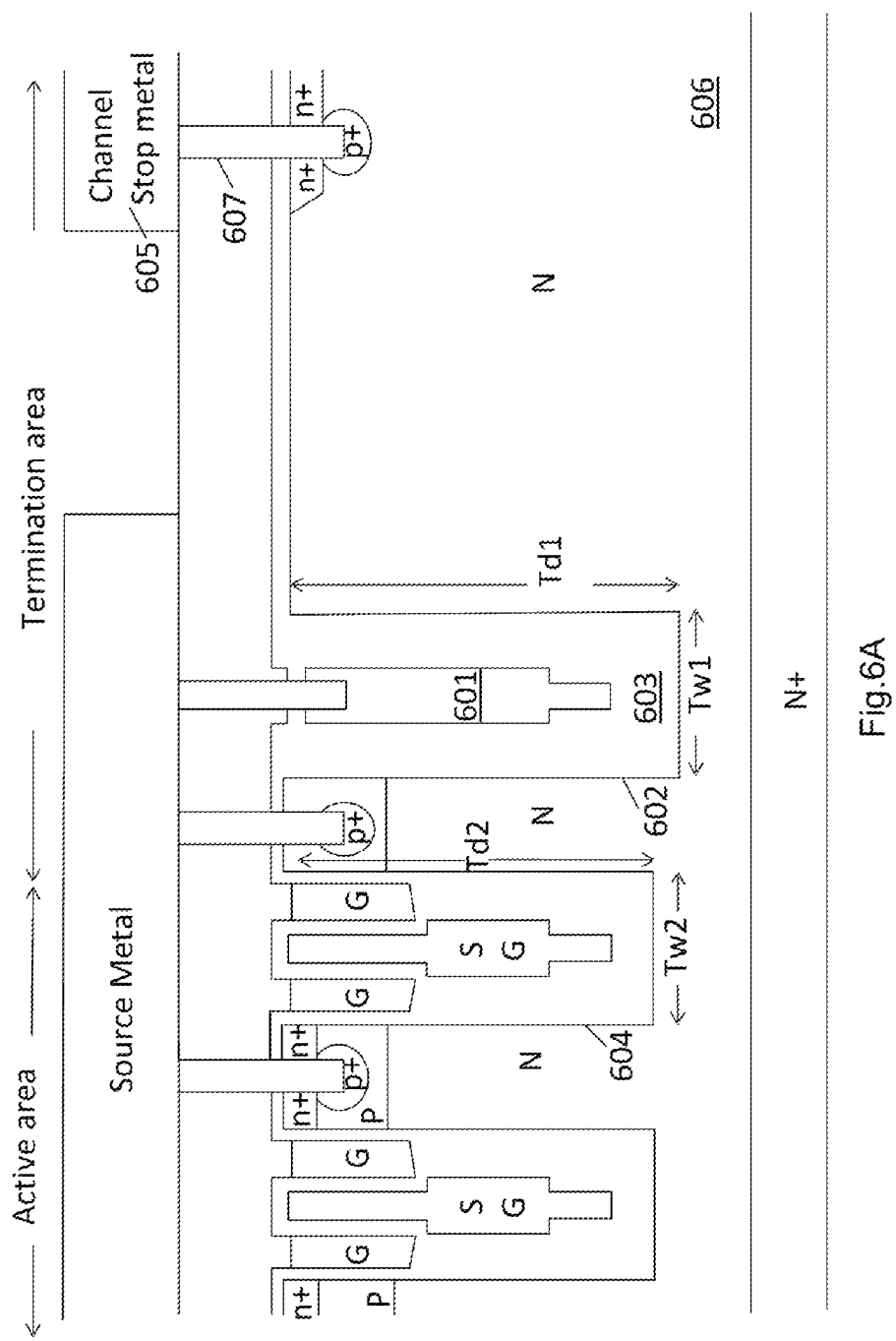
FIG. 6A is a cross-sectional view of another preferred embodiment according to the present invention.

Please refer to FIG. 6A for a preferred embodiment of termination area according to the invention with a same active area structure as FIG. 2, which comprises at least one trench field plate 601 formed in an edge trench 602 and surrounded with the TSO 603, wherein the trench width Tw1 of the edge trench 602 is greater than or equal to the trench width Tw2 of the gate trench 604 in active area, and the trench depth Td1 of the edge trench 602 is greater than or equal to the trench depth Td2 of the gate trench 604 in the active area. Furthermore, in the termination area, a channel stop metal 605 is connected to the N epitaxial layer 606 through a trenched channel stop contact 607.

Please refer to FIG. 6B for another preferred embodiment of the termination area according to the invention, compared to FIG. 6A, the termination area in FIG. 6B further comprises multiple floating P body regions 651 having floating voltage and located between the edge trench and and the channel stop region.

Figure 7:
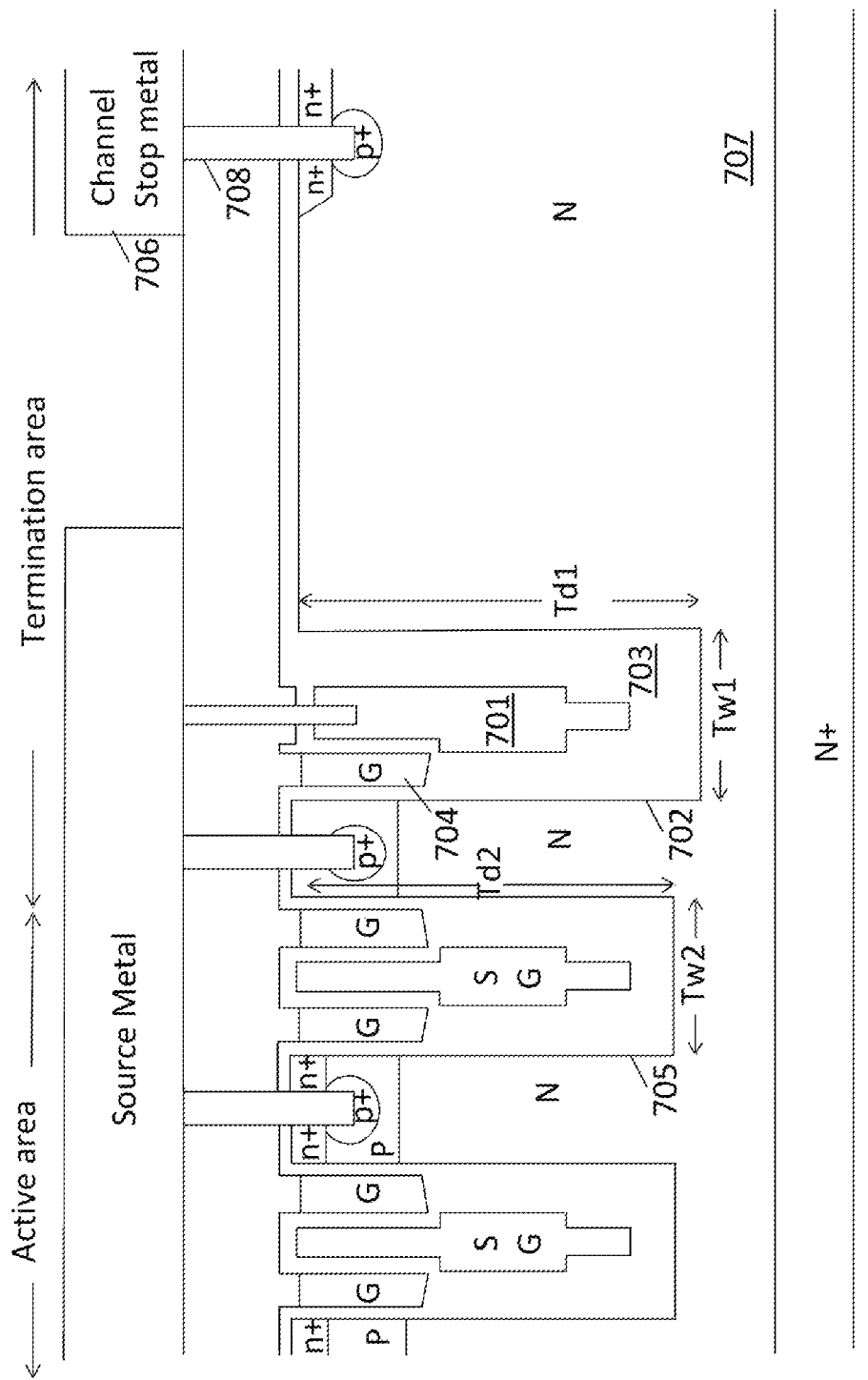
FIG. 7 is a cross-sectional view of another preferred embodiment according to the present invention.

Please refer to FIG. 7 for another preferred embodiment of the termination area according to the invention which comprises at least one trench filed plate 701 formed in an edge trench 702 and: surrounded with TSO 703 at one sidewall of the edge trench 702; surrounded with a gate electrode 704 at another sidewall of upper portion of the edge trench 702 near the active area. The trench width Tw1 of the edge trench 702 is greater than or equal to the trench width Tw2 of the gate trench 705 in the active area, and the trench depth Td1 of the edge trench 702 is greater than or equal to the trench depth Td2 of the gate trench 705 in the active area. Furthermore, in the termination area, a channel stop metal 706 is connected to the N epitaxial layer 707 through a trenched channel stop contact 708.

Please refer to FIG. 8A for a preferred embodiment of termination area according to the invention with a same active area structure as FIG. 3, which comprises at least one trench field plate 801 formed in a first edge trench 802 and surrounded with the TSO 803, wherein the trench width Tw1 of the first type edge trench 802 is greater than or equal to the trench width Tw2 of the first type gate trench 804 in active area, and the trench depth Td1 of the first type edge trench 802 is greater than or equal to the trench depth Td2 of the first type gate trench 804 in the active area. Furthermore, a channel stop metal is connected to the N epitaxial layer through a trenched channel stop contact.

Figure 8B:
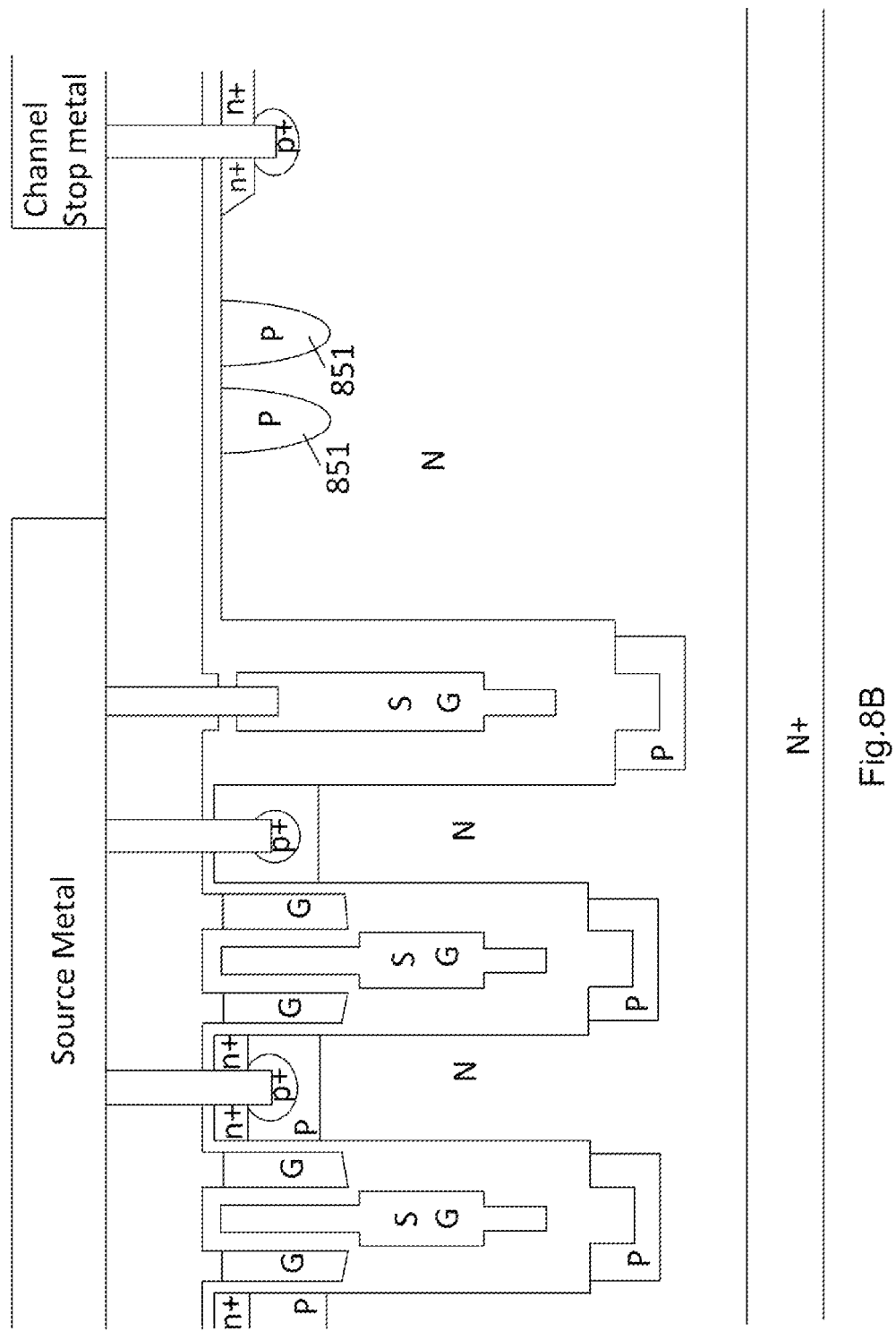
FIG. 8B is a cross-sectional view of another preferred embodiment according to the present invention.

Please refer to FIG. 8B for another preferred embodiment of the termination area according to the invention, compared to FIG. 8A, the termination area in FIG. 8B further comprises multiple floating P body regions 851 having floating voltage and located between the first edge trench and and the channel stop region.

Please refer to FIG. 9 for another preferred embodiment of the termination area according to the invention which comprises at least one trench filed plate 901 formed in a first type edge trench 902 and: surrounded with TSO 903 at one sidewall of the first type edge trench 902; surrounded with a gate electrode 904 at another sidewall of upper portion of the first type edge trench 902 near the active area. The trench width Tw1 of the first type edge trench 902 is greater than or equal to the trench width Tw2 of the first type gate trench 905 in the active area, and the trench depth Td1 of the first type edge trench 902 is greater than or equal to the trench depth Td2 of the first type gate trench 905 in the active area.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A shielded gate trench (SGT) MOSFET formed in an epitaxial layer of a first conductivity type onto a substrate of said first conductivity type, further comprising:
   a plurality of gate trenches formed in an active area, surrounded by source regions of said first conductivity type encompassed in body regions of a second conductivity type near a top surface of said epitaxial layer, each of said plurality of gate trenches having a shielded gate electrode disposed in the middle and a pair of split gate electrodes disposed surrounding upper portion of said shielded gate electrode;
   a two stepped oxide (TSO) below said pair of split gate electrodes as a first oxide layer formed in each of said plurality of gate trenches, said TSO having greater oxide thickness along lower sidewalls of said plurality of gate trenches than along upper sidewalls;
   a second oxide layer as a gate oxide formed between said pair of split gate electrodes and adjacent sidewalls of said plurality of gate trenches; and
   a third oxide layer formed on upper portion of said shielded electrode during gate oxide growth, isolating said shielded gate electrode from said pair of split gate electrodes;
   said plurality of gate trenches further comprising a first type gate trench and a second type gate trench in said epitaxial layer, wherein:
   said second type gate trench is below said first type gate trench and has trench width narrower than said first type gate trench;
   said second type gate trench is filled up with said first oxide layer and is surrounded by a super junction region; and
   said super junction region has a first doped column region of said second conductivity type formed adjacent to sidewalls and a bottom of said second type gate trench, and a second doped column region of said first conductivity type formed in parallel and surrounded with said first doped column region;
   said SGT MOSFET further comprising a termination area having at least one trench field plate in an edge trench and surrounded with said TSO, wherein said edge trench has a trench width and a trench depth greater than or equal to said plurality of gate trenches in said active area; and
   said epitaxial layer comprises a single epitaxial layer having uniform doping concentration.

2. The SGT MOSFET of claim 1, wherein said epitaxial layer comprises a lower epitaxial layer between said substrate and said super junction region with resistivity R1, and an upper epitaxial layer with resistivity R2, wherein R1<R2.

3. The SGT MOSFET of claim 2, wherein said epitaxial layer comprises a lower epitaxial layer between said substrate and said super junction region with resistivity R1, a middle epitaxial layer located in said super junction region with resistivity R2 and an upper epitaxial layer with resistivity R3, wherein R1<R2<R3 or R1<R3<R2.

4. A shielded gate trench (SGT) MOSFET formed in an epitaxial layer of a first conductivity type onto a substrate of said first conductivity type, further comprising:
   a plurality of gate trenches formed in an active area, surrounded by source regions of said first conductivity type encompassed in body regions of a second conductivity type near a top surface of said epitaxial layer, each of said plurality of gate trenches having a shielded gate electrode disposed in the middle and a pair of split gate electrodes disposed surrounding upper portion of said shielded gate electrode;
   a two stepped oxide (TSO) below said pair of split gate electrodes as a first oxide layer formed in each of said plurality of gate trenches, said TSO having greater oxide thickness along lower sidewalls of said plurality of gate trenches than along upper sidewalls;
   a second oxide layer as a gate oxide formed between said pair of split gate electrodes and adjacent sidewalls of said plurality of gate trenches; and
   a third oxide layer formed on upper portion of said shielded electrode during gate oxide growth, isolating said shielded gate electrode from said pair of split gate electrodes;
   said plurality of gate trenches further comprising a first type gate trench and a second type gate trench in said epitaxial layer, wherein:
   said second type gate trench is below said first type gate trench and has trench width narrower than said first type gate trench;
   said second type gate trench is filled up with said first oxide layer and is surrounded by a super junction region; and
   said super junction region has a first doped column region of said second conductivity type formed adjacent to sidewalls and a bottom of said second type gate trench, and a second doped column region of said first conductivity type formed in parallel and surrounded with said first doped column region;
   said SGT MOSFET further comprising a termination area having at least one trench field plate in an edge trench and surrounded with said TSO, wherein said edge trench has a trench width and a trench depth greater than or equal to said plurality of gate trenches in said active area; said termination area further comprising multiple floating body regions of said second conductivity type and having floating voltage; and
   said epitaxial layer comprises a single epitaxial layer having uniform doping concentration.

5. The SGT MOSFET of claim 1 further comprising a termination area having at least one trench field plate surrounded with said TSO at one sidewall of an edge trench, and with a gate electrode at another sidewall of upper portion of said edge trench near said active area, wherein said edge trench has a trench width and a trench depth greater than or equal to said plurality of gate trenches in the active area.

6. The SGT MOSFET of claim 1 further comprising a termination area having at least one trench field plate in a first type edge trench and surrounded with said TSO, wherein said first type edge trench has a trench width and a trench depth greater than or equal to said first type gate trench in the active area.

7. The SGT MOSFET of claim 6, wherein said termination area further comprising multiple body regions having of said second conductivity type and having floating voltage.

8. The SGT MOSFET of claim 1 further comprising a termination area having at least one trench filed plate surrounded with said TSO at one sidewall of a first type edge trench, and with a gate electrode at another sidewall of upper portion of said first type edge trench near active area, wherein said first type edge trench has a trench width and a trench depth greater than or equal to said first type gate trench in the active area.

* * * * *